United States Patent [19]

Mori et al.

[11] Patent Number: 5,051,295

[45] Date of Patent: Sep. 24, 1991

[54] PROTECTIVE FILM FOR PHOTO MASKS AND LITH FILMS

[75] Inventors: Shigeo Mori; Atsunori Yaguchi, both of Tokyo, Japan

[73] Assignee: Idemitsu Petrochemical Company Limited, Tokyo, Japan

[21] Appl. No.: 360,935

[22] PCT Filed: Jun. 6, 1988

[86] PCT No.: PCT/JP88/00546

§ 371 Date: Mar. 17, 1989

§ 102(e) Date: Mar. 17, 1989

[87] PCT Pub. No.: WO89/01650

PCT Pub. Date: Feb. 23, 1989

[30] Foreign Application Priority Data

Aug. 10, 1987 [JP] Japan ................. 62-199636

[51] Int. Cl.$^5$ .................. B32B 9/04; H01L 21/00
[52] U.S. Cl. ........................... 428/195; 428/76; 428/913; 428/520; 428/704; 428/695; 428/411.1; 428/901; 428/65; 428/201; 428/203; 428/204; 428/209; 430/4; 430/5; 430/6; 430/7; 430/3; 430/320; 430/321
[58] Field of Search ............ 430/4, 5, 6, 7, 3, 320, 430/321; 428/195, 76, 913, 520, 704, 695, 411.1, 901, 65, 201, 203, 204, 209

[56] References Cited

U.S. PATENT DOCUMENTS

| 4,108,805 | 8/1978 | Dieck et al. ............... 521/50 X |
| 4,145,218 | 3/1979 | Habu et al. ............... 430/420 |
| 4,242,491 | 12/1980 | Hergenrother et al. ............ 525/168 |
| 4,264,531 | 4/1951 | Li et al. ............... 528/168 X |
| 4,543,319 | 9/1985 | Chao et al. ............ 430/312 |
| 4,735,890 | 4/1988 | Nakane ............... 430/5 X |

FOREIGN PATENT DOCUMENTS

| 49-105469 | 10/1974 | Japan . |
| 49-131681 | 12/1974 | Japan . |
| 51-111075 | 10/1976 | Japan . |
| 55-69142 | 5/1980 | Japan . |
| 55-158113 | 12/1980 | Japan . |
| 59-2449 | 1/1984 | Japan . |

Primary Examiner—Ellis P. Robinson
Assistant Examiner—William P. Watkins, III
Attorney, Agent, or Firm—Armstrong, Nikaido, Marmelstein, Kubovcik & Murray

[57] ABSTRACT

The present invention relates to a durable pattern forming material having a protective film comprising a radiation cured product of a curable compound, comprising a phosphazene of the formula:

$$-\{NP(x)(Y)\}_n-$$

wherein at least one of x and y is a polymerizable group and n is at least 3, superior in mechanical, optical and chemical properties which is characterized in that a cured protective film of a curable compound is formed on a photo mask or lith film on which a pattern of desired shape has been provided. This pattern forming material can be suitably used for formation of pattern in production of IC, printed circuit and hybrid IC.

11 Claims, No Drawings

PROTECTIVE FILM FOR PHOTO MASKS AND LITH FILMS

The present invention relates to novel durable pattern forming materials. More particularly, it relates to a photo mask or a lith film provided with a protective film which has excellent mechanical, optical and chemical properties and which can be suitably used for exposure to form a pattern in making IC, printed circuits, hybrid IC, etc.

BACKGROUND OF THE INVENTION

Recently, remarkable progress has been made in the semiconductor industry, such as of LSI, and ultra LSI, and integration in semiconductor elements has been rushed into an era of megabit. Thus, fine processing of the order of submicron is being demanded.

In production of such semiconductor elements, so-called lithographic techniques are generally used, which comprise providing a photoresist layer on a substrate, such as a silicon wafer, then irradiating the photo resist layer, with an actinic ray, through a photo mask or lith film provided thereon with a pattern of the desired shape, and thereafter subjecting the layer to development treatment and etching treatment to form the pattern on the silicon wafer substrate or printed circuit.

Photo resists include two types; the negative type in which only the portion exposed to actinic ray is cured and the unexposed portion is dissolved out upon development; and the positive type in which only the portion exposed to actinic ray is dissolved out upon development, which is directly opposite to the negative type.

Generally, a protective film, for prevention of damage to the pattern and to impart durability, is used over the materials used for forming the pattern, such as a photo mask and lith film.

As a lith film provided with a protective film, there is known one which comprises a material such as a polyester film, provided with a pattern of the desired shape, on which is laminated an organic film, such as a polyester, through an adhesive.

However, such lith films having a protective film are inferior in durability because the protective film per se is readily marred. Besides, since the thickness of the film is about 10–20 μm, when actinic rays are irradiated onto the photoresist layer through this lith film, deflection and scattering of the actinic ray can cause changes in the line width of the pattern and reduction in resolution. There are also photo masks and lith films free from lamination, but in this case, the pattern is uncovered and is readily subject to damage due to wear in operation.

The object of the present invention is to provide a pattern forming material having superior durability which is free from the defects of the conventional pattern forming material, such as photo mask and lith film provided with protective film, and which is provided with a protective film, which is excellent in mechanical, chemical and optical properties, by simple means without causing a reduction in resolution.

SUMMARY OF THE INVENTION

The inventors have made intensive research in an attempt to develop pattern forming materials, such as photo masks and lith films provided with a protective film, having the above mentioned excellent properties. As a result, it has been found that by using a curable compound as the material for the protective film, a protective film comprising the curable compound can be formed on a photo mask or lith film by a very simple means without deterioration of resolution; and the resulting protective film is excellent in mechanical, optical and chemical properties, and thus a pattern forming material of excellent durability can be produced. The present invention has been accomplished based on these findings.

DETAILED DESCRIPTION OF THE INVENTION

That is, according to the present invention, there is provided a durable pattern forming material, comprising a photo mask or lith film, provided with a pattern of desired shape, and a cured protective overlay film of a curable compound formed thereover.

The photo mask used in the pattern forming materials of the present invention is not critical and those which are ordinarily used for conventional photo masks, for example, glass or or quartz, such as blue sheet glass, white sheet glass and low expansion glass, can be used.

The lith film is also not critical and those which are used for conventional lith films, for example, plastic films such as polyester, polyvinyl chloride and polyvinyl alcohol films can be used. Especially preferred is polyester film.

According to the present invention, a protective film comprising a cured product of a curable compound is provided as an overlay on the above mentioned photo mask or lith film having a pattern of desired shape provided by conventional method.

The curable compound is not per se critical and may be any compound which is cured by irradiation with actinic energy rays such as ultraviolet ray, far ultraviolet ray, electron ray, X ray and τ ray and can provide cured products superior in mechanical, chemical or optical properties.

As such curable compounds, mention may be made of, for example, curable phosphazene compounds, photopolymerizable monomers, photopolymerizable prepolymers, urethane compounds, epoxy compounds, silicone compounds and organotitanium compounds. These may be used alone or in combinations of two or more.

As the curable phosphazene compounds, there may be used those which are represented by the formula:

$$[NP(X)_p(Y)_q]_n \qquad (I)$$

wherein at least one of X and Y, which may be identical or different, represents a polymerization or a non-polymerization curable group, p and q each represents a number of 0 or more, with the sum of p and q being 2, and n represents an integer of 3 or more.

The above polymerization curable group may be one which has an unsaturated bond which is polymerized by heating or irradiation with ultraviolet ray or electron ray, which is not critical. Preferred are those which contain an acryl group, a methacryl group, a vinyl group or an allyl group and especially preferred are acryloyloxy groups and methacryloyloxy groups.

As the non-polymerization curable group, mention may be made of, for example, a phenoxy group, a halogenated phenoxy group, an alkoxy group, a halogenated alkoxy group, an alkylamino group and a halogenated alkylamino group.

In the present invention, a group represented by the following formula is suitable as the above X and Y.

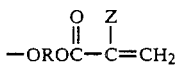

wherein R is an alkylene group of 1-12 carbon atoms and Z is a hydrogen atom or a methyl group.

The group R in the above formula (II) may be a straight chain alkylene group or a branched chain alkylene group. Preferred is an ethylene group.

As examples of the group represented by the above formula (II), mention may be made of residues obtained by removing a hydrogen atom from a hydroxyl group of methacrylates such as 2-hydroxyethyl methacrylate, 2-hydroxypropyl methacrylate, 2-hydroxybutyl methacrylate, 3-hydroxybutyl methacrylate, 4-hydroxybutyl methacrylate, 5-hydroxypentyl methacrylate, 6-hydroxy-3-methylhexyl methacrylate, 5-hydroxyhexyl methacrylate, 3-hydroxy-2-t-butylpropyl methacrylate, 3-hydroxy-2,2-dimethylhexyl methacrylate, 3-hydroxy-2-methylethylpropyl methacrylate and 12-hydroxydodecyl methacrylate and residues obtained by removing a hydrogen atom from a hydroxyl group of acrylates such as 2-hydroxyethyl acrylate, 2-hydroxypropyl acrylate, 2-hydroxybutyl acrylate, 3-hydroxybutyl acrylate, 4-hydroxybutyl acrylate, 5-hydroxypentyl acrylate, 6-hydroxy-3-methylhexyl acrylate, 5-hydroxyhexyl acrylate, 3-hydroxy-2-t-butylpropyl acrylate, 3-hydroxy-2,2-dimethylhexyl acrylate, 3-hydroxy-2-methylethylpropyl acrylate and 12-hydroxydodecyl acrylate. Especially preferred are 2-hydroxyethyl methacrylate residue and 2-hydroxyethyl acrylate residue.

When the above various hydroxyalkyl methacrylate residues and hydroxyalkyl acrylate residues are compared, the latter are preferred because they have higher crosslinking rates.

The curable phosphazene compounds represented by the formula (I) are those in which n is an integer of 3 or more and preferred are those where n is 3-18. Especially, cyclic compounds where n is 3 or 4, or mixtures thereof, are preferred.

Cured films of these curable phosphazene compounds have excellent mechanical, chemical and optical properties and additionally have markedly superior adhesiveness to photo mask substrates, such as glass substrates, and quartz substrates, and lith film substrates such as polyester films. Especially, phosphazene compounds of the formula (I) where X and Y are groups derived from hydroxyalkyl methacrylates and hydroxyalkyl acrylates show excellent adhesiveness.

The above curable phosphazene compounds can be prepared by known methods.

For example, a phosphazene compound, in which the chlorine of hexachlorocyclotriphosphazene is partially or totally substituted with a 2-hydroxyethyl methacrylate residue, can be obtained by reacting hexachlorocyclotriphosphazene with 2-hydroxyethyl methacrylate. In this case, chlorine is preferably totally substituted, but a part of chlorine may be retained.

In the above reaction, use of a tertiary amine is advantageous for acceleration of the dehydrochlorination reaction.

As the tertiary amine, mention may be made of, for example, trimethylamine, triethylamine, triisopropylamine, tri-n-propylamine, tri-n-butylamine, pyridine and N,N,N',N'-tetraethylenediamine. Pyridine is preferred.

The above reaction is normally effected in an organic solvent containing no water.

Examples of organic solvents are benzene, toluene, xylene, chloroform, cyclohexane, methylene chloride and tetrahydrofuran. These may be used alone or in combinations of two or more.

In the present invention, it is preferred to use a trimer (hexachlorocyclotriphosphazene), tetramer or oligomer of dichlorophosphazene as the chlorophosphazene compound starting material for the preparation of phosphazene compound.

This is because, in case of phosphazene compounds obtained by using such telomer or oligomer, the crosslinking density in the film (cured phosphazene compound) can be easily controlled.

As the photopolymerizable monomers, mention may be made of, for example, monofunctional compounds such as methyl acrylate, 2-ethylhexyl acrylate, 2-hydroxyethyl acrylate and 2-hydroxypropyl acrylate, bifunctional compounds such as 1,3-butanediol diacrylate, 1,4-butanediol diacrylate, 1,6-hexanediol diacrylate, ethylene glycol diacrylate, diethylene glycol diacrylate, triethylene glycol diacrylate, tetraethylene glycol diacrylate, neopentyl glycol diacrylate, polyethylene glycol diacrylate, and hydroxypivalic acid ester neopentyl glycol diacrylate and polyfunctional compounds, such as trifunctional or higher compounds, such as trimethylolpropane triacrylate, pentaerythritol triacrylate, dipentaerythritol hexaacrylate and triallyl isocyanate.

As the photopolymerizable prepolymers, mention may be made of, for example, prepolymers containing at least one acryloyl group such as polyester acrylate, polyurethane acrylate, epoxy acrylate, polyether acrylate, melamine acrylate, oligo acrylate, alkyd acrylate, polyol acrylate, and silicon acrylate.

Among them, important prepolymers are acrylates of polyester, epoxy and polyurethane polymers. The polyester acrylates are those which are prepared by producing a polyester, for example, from polyhydric alcohols such as ethylene glycol, 1,4-butanediol, 1,6-hexanediol, diethylene glycol, trimethylolpropane, dipropylene glycol, polyethylene glycol, polypropylene glycol, pentaerythritol and dipentaerythritol, and polybasic acids such as phthalic acid, adipic acid, maleic acid, trimellitic acid, itaconic acid, succinic acid, terephthalic acid and alkenylsuccinic acid; and then acrylating the resulting polyester. Typical examples of the polyester acrylate are adipic acid/1,6-hexanediol/acrylic acid type, phthalic anhydride/propylene oxide/acrylic acid type and trimellitic acid/diethylene glycol/acrylic acid.

The epoxy acrylates are obtained by esterifying the epoxy groups of epoxy resins with acrylic acid to form a functional group of the acryloyl group. Typical examples thereof are bisphenol-A-epichlorohydrin type epoxy resin/acrylic acid, phenol novolak-epichlorohydrin type epoxy resin/acrylic acid and alicyclic epoxy resin/acrylic acid.

Polyurethane acrylates can be obtained, for example, by reacting an isocyanate compound such as tolylene diisocyanate with an acrylate having a pendant hydroxyl group, such as 2-hydroxyethyl acrylate. In many cases, the central part of the molecule has a polyester structure with isocyanate groups at both ends and thus, the acrylate is produced.

The urethane compounds which are curable compounds include, for example, oil modified polyurethane type, moisture-curable polyurethane resin type, block polyurethane type and catalyst-curable polyurethane type.

The epoxy compounds which are curable compounds include, for example, an epoxy resin to which a suitable curing agent has been added, an ester obtained by reaction of an epoxy resin with a fatty acid, and a combination of an epoxy resin and an alkyd resin.

The silicone compounds which are curable compounds include, for example, precondensates obtained, for example, by mixing monomethyltrichlorosilane or monoethyltrichlorosilane with a small amount of dimethyldichlorosilane or diethyldichlorosilane and reacting them. This is normally used in the form of solution in a suitable solvent, to which a curing accelerator, such as a soluble fatty acid salt or zinc octinate may be added, if necessary.

Furthermore, representative examples of the organotitanium compound, which is a curing compound, are butyl titanate compounds, such as tetrabutoxytitanium.

Among the aforementioned various curable compounds, curable phosphazene compounds, photopolymerizable prepolymers and silicone compounds are preferred, and curable phosphazene compounds are especially preferred.

The pattern forming material of the present invention comprises a photo mask, or a lith film having provided thereon a pattern of desired shape, on which a cured protective film of the above-mentioned curable compound is formed. This cured protective film can be formed by using the curable compound as such or, if necessary, by dissolving or dispersing the curable compound in an organic solvent to prepare a composition, and then coating this composition on a photo mask or a lith film to form a coating film, and curing it.

As the organic solvents, mention may be made of, for example, ketones such as methyl ethyl ketone, methyl isobutyl ketone and cyclohexanone, aromatic hydrocarbons such as benzene, toluene and xylene, halogenated hydrocarbons such as chloroform and methylene chloride, alcohols such as methanol, ethanol, propanol and butanol and ethers such as tetrahydrofuran and dioxane. These may be used alone or in combinations of two or more. When a curable phosphazene compound is used as a curing compound, a mixed solvent of a ketone and an alcohol is preferred and especially preferred are a mixed solvent of methyl isobutyl ketone and isopropyl alcohol or isobutyl alcohol.

Mixing ratios of the organic solvent and the curable phosphazene compounds are not critical, but usually are 1:9-9:1 in weight ratio. Especially, compositions comprising a mixture of the organic solvent and the curable phosphazene compound, in a ratio of 9:1-5:5 have viscosities in favorable ranges and thus are suitable for operability.

When a photopolymerizable compound or a thermopolymerizable compound is used as the curable compound, if necessary, curing accelerators, such as photopolymerization initiators and thermopolymerization initiators, may be added to the composition.

For example, when a curing method using ultraviolet rays or visible light is utilized, it is preferred to add, as a photopolymerization initiator, 1-hydroxycyclohexylphenyl ketone, dibenzoyl, benzoylmethyl ether, benzoinethyl ether, p-chlorobenzophenone, p-methoxybenzophenone, benzoyl peroxide, di-tert-butyl peroxide and camphorquinone.

These photopolymerization initiators may be used alone or in combinations of two or more.

Amount of the photopolymerization initiator is normally 0.05-5.0 parts by weight per 100 parts by weight of the curable compound.

Furthermore, when a heat curing method or cold curing method is used, it is preferred to use peroxides or amine compounds as the polymerization initiator alone or in combination.

As examples of peroxides, mention may be made of benzoyl peroxide, p-chlorobenzoyl peroxide, 2,4-dichlorobenzoyl peroxide, t-butyl hydroperoxide, di-t-butyl peroxide, dicumyl peroxide, t-butyl peroxyacetate, diacetate, and t-butyl peroxybenzoate.

As examples of the amine compounds, mention may be made of N,N-diethanol-p-toluidine, dimethyl-p-toluidine, p-toluidine, methylamine, t-butylamine, methylethylamine, diphenylamine, 4,4'-dinitrodiphenylamine, o-nitroaniline, p-bromoaniline and 2,4,6-tribromoaniline.

In this case, the amount of the peroxide or the amine compound is ordinarily 0.05-5.0 parts by weight per 100 parts by weight of the curable compound.

If necessary, together with the above curable compounds, there may be further used a curable compound, for example, a vinyl ester of a carboxylic acid such as vinyl acetate or vinyl stearate or an unsaturated dicarboxylic acid having ethylenic double bond such as fumaric acid, maleic acid, maleic anhydride, itaconic acid or itaconic anhydride.

Moreover, to the composition may be further added, if necessary, powdery or fibrous inorganic or organic fillers such as silica, glass, metals, ceramics and organic fibers and furthermore, antioxidants or ultraviolet absorbers may also be added.

The inorganic or organic fillers are preferably those which do not interfere with transmission of actinic rays, for example, inorganic fillers such as colloidal silica and organic fillers such as polymethyl methacrylate.

According to the present invention, the thus prepared composition containing a curable compound is coated on a photo mask or a lith film, which had been provided with a pattern of the desired shape, by known methods, such as spinning method, spraying method, and roll coating method, then the solvent is removed and, thereafter, the coated composition is heated at room temperature or irradiated with ultraviolet rays, electron rays, X rays, $\tau$ rays or the like to cure the curable compound to form a protective film.

Where curing is performed by irradiation with ultraviolet rays, it is desired to irradiate with ultraviolet rays having a wavelength within the range of 200-550 nm for 0.1 second or more, preferably 0.5-300 seconds.

In this case, the integrated volume of the irradiated ray is ordinarily 100-5,000 $mJ/cm^2$.

In case curing is carried out by heating, it is preferred to perform complete curing at a temperature of 100° C. or higher.

The thickness of the protective film is preferably 0.01-500 $\mu$m. If the thickness is less than 0.01 $\mu$m, its effect as a protective film cannot be fully displayed, and if it is more than 500 $\mu$m, in thickness, the optical properties, such as pattern resolution are deteriorated.

The thus formed cured protective film of curable compound is superior in mechanical, optical and chemical properties and the pattern forming material of the present invention is superior in durability. Especially when the cured product of a curable phosphazene compound is selected as the protective film, the protective film is excellent in flexibility and is especially excellent in adherence to an emulsion layer of the photo mask or lith film and besides it is also superior in durability against ultraviolet rays.

BEST MODE FOR CARRYING OUT THE INVENTION

The following nonlimiting examples further illustrate the present invention.

Evaluation of protective film was effected in the following manner.

(1) Initial adherence:

One hundreds squares of 1 mm×1 mm were made on protective film and thereon was applied an adhesive tape and then the adhesive tape was peeled off and the number of squares which were not peeled off was counted. This procedure was repeated 5 times for the same portion and an average number was determined. For example, when the number of squares, which were not peeled off, is 60, this is shown as 60/100 in the tables hereinafter. The indication "100/100" means that no squares were peeled off.

(2) Wear resistance:

The surface of protective film was rubbed with No. 400 sandpaper and the state of the rubbed surface was observed.

(3) Dimensional stability:

A negative (transparent portion) pattern of 50.0 μm in width was provided on a master substrate and this was transferred to a separate lith film, thereby to obtain a positive (black portion) pattern. Ratio of increment in width of line of the positive pattern to the width of the original pattern was calculated.

(4) Pencil hardness:

5H: Scratching by a pencil of 5H in hardness gave no flaw on the surface, but that by a pencil of 6H gave a flaw.

4H: Scratching by a pencil of 4H gave no flaw, but that by a pencil of 5H gave a flaw.

2H: Scratching by a pencil of 2H gave no flaw, but that by a pencil of 3H gave a flaw.

H: Scratching by a pencil of H gave no flaw, but that by a pencil of F gave a flaw.

(5) Warp of film:

A protective film having a size of 250×300 mm after formation was placed on a smooth surface and the maximum height of film edge from the smooth surface was measured.

(6) Durability against exposure to ultraviolet ray:

A protective film was irradiated with ultraviolet rays for 5 seconds (2,000 mJ/cm$^2$) from a light source (high pressure mercury lamp of 120 W) of a commercially available ultraviolet ray irradiating device placed at a distance of 1 cm from the protective film. This irradiation was repeated many times. The thus irradiated surface was visually observed.

(7) Flexibility:

A polyester lith film substrate (100×100 mm), on which a protective film was formed, was wound around a wooden shaft with the substrate being exposed. This was allowed to stand as such for 1 hour. Then, the state of the surface of the protective film was visually observed.

PREPARATION EXAMPLE 1

Preparation of Curable Phosphazene Compound (A)

86.8 Grams of hexachlorocyclotriphosphazene was dissolved in 338 g of dehydrated benzene in a 2 liter flask. To this benzene solution were added 310 g of pyridine and 0.23 g of hydroquinone, followed by stirring.

Separately, 200 ml of 2-hydroxyethyl methacrylate was dissolved in 237 ml of benzene and the resulting solution was added dropwise into the above flask and reaction was allowed to proceed at 60° C. for 30 hours. After the reaction, hydrochloride of pyridine was removed by filtration.

The filtrate was washed with water and dried with Glauber's salt and solvent was removed by distillation under reduced pressure to obtain 200 g of viscous 1,1,3,3,5,5-hexa(methacryloylethylenedioxy)cyclotriphosphazene.

PREPARATION EXAMPLE 2

Preparation of Curable Phosphazene Compound (B)

In a 2 liter flask, equipped with a thermometer, a stirrer, a dropping funnel and a condenser, were charged 300 ml of tetrahydrofuran and 25.5 g of metallic sodium, and thereto was added dropwise 104.3 g (1.11 mol) of phenol, followed by refluxing for 3 hours to obtain a phenolate.

Then, a solution, prepared by dissolving 193 g (0.555 mol) of hexachlorocyclotriphosphazene in 400 ml of benzene, was added dropwise to the tetrahydrofuran solution containing phenolate and then, reaction was allowed to proceed for 4 hours under reflux.

Thereafter, the temperature of the reaction mixture was returned to room temperature and thereto was added 352 g (4.45 mols) of pyridine and furthermore, 381 g (2.45 mols) of 2-hydroxyethyl methacrylate were gradually added dropwise from the dropping funnel, the reaction was allowed to proceed at 60° C. for 16 hours. The precipitated solid was filtered off and the resulting filtrate was subjected to distillation under reduced pressure to remove the solvent. The residue was sufficiently dried to obtain 452 g of a yellow liquid product.

EXAMPLE 1

To a solution having a viscosity of 10 centipoise, which was prepared by dissolving the curable phosphazene compound (A) obtained in Preparation Example 1 in methyl isobutyl ketone, was added 1-hydroxycyclohexylphenyl ketone (Ciba Geigy Co.) as a photopolymerization initiator, in an amount of 3 parts by weight per 100 parts by weight of said phosphazene compound, to prepare a coating composition.

Then, the above coating composition was coated, by a spraying method, on a blue sheet glass substrate, which had previously been provided with a circuit pattern, and was irradiated with ultraviolet rays from an ultraviolet ray source of 80 W at a distance of 15 cm from the coated substrate at an integrated light volume of 2,940 mJ/cm$^2$, thereby to obtain a protective film (A) of 4 μm in film thickness.

EXAMPLE 2

Example 1 was repeated except that the curable phosphazene compound (B) obtained in Preparation Example 2 was used in place of the curable phosphazene compound (A), thereby to obtain a protective film (B).

Results of evaluation of protective films (A) and (B) are shown in Table 1.

TABLE 1

| Items of evaluation | Example 1 Protective film (A) | Example 2 Protective film (B) |
| --- | --- | --- |
| Initial adherence | 100/100 *1 | 100/100 *1 |
| Wear resistance | No flaw | No flaw |
| Pencil hardness | 5 H | 4 H |
| Dimensional change | Less than 1% (1 μm) | Less than 2% (1 μm) |
| Durability against ultraviolet ray | No change after irradiation of more than 100,000 times | No change after irradiation of more than 100,000 times. |

*1 No peeling of squares was recognized in both the transparent portion and black portion (emulsion layer).

EXAMPLE 3

Example 1 was repeated except that a polyester lith film substrate, previously provided with a circuit pattern, was used in place of the blue sheet glass photomask substrate, thereby to obtain a protective film (C).

EXAMPLE 4

Example 2 was repeated except that a polyester lith film previously provided with a circuit pattern, was used in place of the blue sheet glass photo mask substrate, thereby to obtain a protective film (D).

COMPARATIVE EXAMPLE 1

A polyester film of 6 μm thickness was laminated on a polyester lith film substrate previously provided with a circuit pattern thereon, through an adhesive layer of 4 μm at room temperature. The resulting laminate layer was called protective film (E).

COMPARATIVE EXAMPLE 2

The surface properties of a polyester lith film previously provided with a circuit pattern thereon, without providing a protective film was evaluated as it was. This surface was called face-A.

Results of evaluation of protective films (C), (D), and (E) and face-A are shown in Table 2.

EXAMPLE 5

An acrylic curable resin (UNIDICK 17-827 manufactured by Dainippon Ink & Chemicals Inc.) was coated on a polyester lith film, which had previously been provided with a circuit pattern thereon, and was irradiated with ultraviolet rays of 80 W at a distance of 15 cm from light source at an integrated light volume of 2,940 mJ/cm$^2$, thereby to obtain a protective film (F) of 4 μm in film thickness.

EXAMPLE 6

A primer (PH 91 manufactured by Toshiba Silicone Co.) diluted with toluene was coated on a polyester lith film, on which a circuit pattern was previously formed, and was set at room temperature for 30 minutes. Then, a silicone type hardcoat material (TOSGUARD 520 manufactured by Toshiba Silicone Co.) was coated thereon. Thereafter, this was subjected to setting at room temperature for 30 minutes and finally heated at 80° C. for 2.5 hours to obtain a protective film (G).

Results of evaluation of the protective films (F) and (G) are shown in Table 3.

TABLE 3

| Item of evaluation | Protective film (F) | Protective film (G) |
| --- | --- | --- |
| Initial adherence | 60/100 | 70/100 |
| Wear resistance | Flaw and partial whitening were recognized. | No flaw was recognized. |
| Pencil hardness | 2 H | 4 H |
| Warp of film | No warp was recognized. | 7.5 mm |
| Dimensional change | 15% (7.5 μm) | 21% (10.5 μm) |
| Durability against Ultraviolet ray | Severe change after irradiation of 50,000 times | Severe change after irradiation of 8,000 times |
| Flexibility | Tearing and cracking occurred in a part of protective film of 4 μm. | Tearing occurred in protective film of 5 μm. |

TABLE 2

| Items of evaluation | Example 3 Protective film (C) | Example 4 Protective film (D) | Comparative Example 1 Protective film (E) | Comparative Example 2 Face-A |
| --- | --- | --- | --- | --- |
| Initial adherence | 100/100 *1 | 100/100 *1 | 0/100 | — |
| Wear resistance | No flaw was seen. | No flaw was seen. | Whitening of film was seen. | Whitening of film an rupture of circuit pattern were seen. |
| Pencil hardness | 5 H | 4 H | H | H |
| Warp of film | No warp was recognized. | No warp was recognized. | 6 mm | No warp was recognized. |
| Dimensional change | 13% (6.5 μm) | 16% (8 μm) | 28% (14 μm) | 13% (6.5 μm) |
| Durability against ultraviolet ray | No change after irradiation of more than 100,000 times | No change after irradiation of more than 100,000 times | Severe change after 50,000 times | |
| Flexibility | No change in protective film of 4 μm | No change in protective film of 7 μm | | |

*1 No peeling of squares was recognized in both the transparent portion and black portion (emulsion layer).

INDUSTRIAL APPLICATION OF THE INVENTION

The durable pattern forming material of the present invention is produced by forming a protective film comprising a cured product of a curable compound superior in mechanical, optical and chemical properties on a photo mask or a lith film on a substrate, provided with a pattern of desired shape, without causing reduction of resolution. This pattern forming material has good durability and can be suitably used for formation of pattern in production of IC, printed circuit, and hybrid IC.

We claim:

1. A durable pattern forming material which comprises a member selected from the group consisting of a photo mask and a lith film having on at least the pattern bearing surface thereof an excellently adherant radiation cured protective film of a curable cyclic phosphazene compound of the formula:

$$-[NP(X)_p(Y)_q]_n- \qquad (I)$$

wherein X and Y are identical or different, wherein X or Y is a polymerization curable group or a non-polymerization curable group, wherein at least one of X and Y is a polymerization curable group, p and q are numerals of zero or greater than zero, the sum of p and q is 2, and n is 3 to 4, and wherein said cured film consists essentially of said cyclic phosphazene compound cross linked by reaction of said polymerizable groups.

2. A material as claimed in claim 1 wherein both of X and Y are polymerizable groups.

3. A material as claimed in claim 2 wherein said polymerizable group corresponds to the formula:

$$-OROC\overset{O}{\underset{\|}{-}}\overset{Z}{\underset{|}{C}}=CH_2 \qquad (II)$$

wherein R is an alkylene group of 2–12 carbon atoms and Z is a hydrogen atom or a methyl group.

4. A durable pattern forming material according to claim 1 wherein the photo mask substrate is a blue sheet glass or a white sheet glass.

5. A durable pattern forming material according to claim 1 wherein the lith film substrate is polyester.

6. A durable pattern forming material according to claim 1 wherein X and Y in the general formula (I) are residues derived removing a hydrogen atom from the hydroxyl group of a methacrylate or an acrylate compound.

7. A durable pattern forming material according to claim 6 wherein the methacrylate is 2-hydroxyethyl methacrylate.

8. A durable pattern forming material according to claim 6 wherein the acrylate is 2-hydroxyethyl acrylate.

9. A composite material which comprises a member selected from the group consisting of a photo mask and a lith film having on at least the pattern bearing surface thereof a film of an uncured radiation curable cyclic phosphazene compound of the formula:

$$-[NP(X)_p(Y)_q]_n- \qquad (I)$$

wherein X and Y are identical or different, wherein X or Y is a polymerization curable group or a non-polymerization curable group, wherein at least one of X and Y is a polymerization curable group, p and q are numerals of zero or greater than zero, the sum of p and q is 2, and n is 3 to 4.

10. A material as claimed in claim 9 wherein both of X and Y are polymerizable groups.

11. A material as claimed in claim 10 wherein said polymerizable group corresponding to the formula:

$$-OROC\overset{O}{\underset{\|}{-}}\overset{Z}{\underset{|}{C}}=CH_2 \qquad (II)$$

wherein R is an alkylene group of 1–12 carbon atoms and Z is a hydrogen atom or a methyl group.

* * * * *